United States Patent
Chang et al.

(10) Patent No.: US 11,215,659 B2
(45) Date of Patent: Jan. 4, 2022

(54) METHOD FOR FASTER TESTING OF MANUFACTURED PCB, APPARATUS, SYSTEM, AND STORAGE MEDIUM USED IN METHOD

(71) Applicant: HONGFUJIN PRECISION ELECTRONICS (TIANJIN) CO., LTD., Tianjin (CN)

(72) Inventors: Meng-Chu Chang, Miao-Li Hsien (TW); Yi-Hua Chiu, Neihu (TW); Chun-Hung Lee, Neihu (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 78 days.

(21) Appl. No.: 16/843,431

(22) Filed: Apr. 8, 2020

(65) Prior Publication Data

US 2021/0190853 A1    Jun. 24, 2021

(30) Foreign Application Priority Data

Dec. 19, 2019   (CN) .......................... 201911316256.2

(51) Int. Cl.
*G01R 31/08* (2020.01)
*G01R 31/28* (2006.01)

(52) U.S. Cl.
CPC ..... *G01R 31/2818* (2013.01); *G01R 31/2805* (2013.01)

(58) Field of Classification Search
CPC .... G01R 31/20; G01R 31/28; G01R 31/2801; G01R 31/2803; G01R 31/2805; G01R 31/22806; G01R 31/2808; G01R 31/2818; G01R 31/281; G01R 31/2812; G01R 31/2889; G01R 31/23181; G01R 31/318505; G01R 31/318508; G01R 31/07328
USPC .................................................. 324/763.01
See application file for complete search history.

(56) References Cited

U.S. PATENT DOCUMENTS

| | | | |
|---|---|---|---|
| 2004/0088626 A1* | 5/2004 | Ichino ............ | G01R 31/318371 714/738 |
| 2008/0164885 A1* | 7/2008 | Hemingway ...... | G01R 31/2818 324/628 |
| 2012/0227019 A1* | 9/2012 | Culp ....................... | G06F 30/30 716/56 |
| 2017/0138887 A1* | 5/2017 | Ghesquiere ........ | G01N 27/3274 |

(Continued)

*Primary Examiner* — Thang X Le
(74) *Attorney, Agent, or Firm* — ScienBiziP, P.C.

(57) ABSTRACT

A method for testing mass-produced PCBs and other electronic components more efficiently, the method includes setting testing parameters based on historical test data and a target decision index, obtaining a first specified number of the target objects to have the full test, and calculating a first yield based on the current test result. The method determine whether the first yield is less than the first yield threshold yield, and obtaining a second specified number of the target objects from the remaining target objects to have the full test, and calculate a second yield when the first yield is larger than or equal to the first yield threshold value. The method further determine whether the second yield is less than the second yield threshold value according to a second comparing command and select some of the remaining target objects to have a sampling test.

19 Claims, 4 Drawing Sheets

(56) References Cited

U.S. PATENT DOCUMENTS

2018/0106859 A1\* 4/2018 Song ................ G01R 31/2889
2020/0182927 A1\* 6/2020 Mo .................... G01R 31/2834

\* cited by examiner

METHOD FOR FASTER TESTING OF MANUFACTURED PCB, APPARATUS, SYSTEM, AND STORAGE MEDIUM USED IN METHOD

FIELD

The subject matter herein generally relates to PCB manufacture.

BACKGROUND

A manufacturing process of printed circuit board (PCB) includes an element assembling process, a packaging process, and a testing process. The testing process includes various tests, such as an Automated Optical Inspection (AOI) test, a Quality Control (QC) test, an integrity checking test, and function tests. The total time of the testing process for PCBs in mass production is too long, and labor cost is too high.

There is room for improvement in the art.

BRIEF DESCRIPTION OF THE FIGURES

Implementations of the present disclosure will be described, by way of embodiment, with reference to the figures.

DETAILED DESCRIPTION

Figure 1:
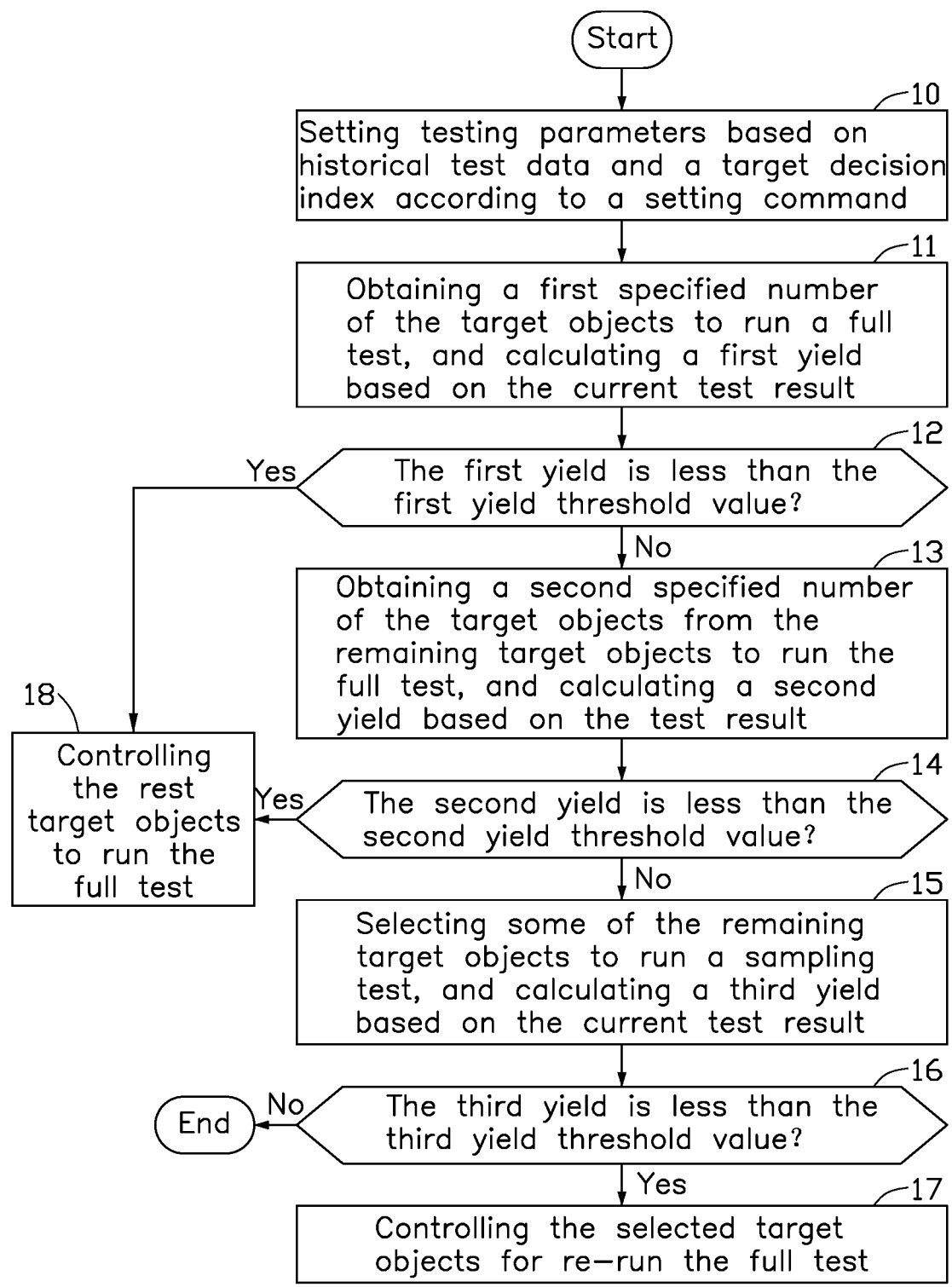
FIG. 1 is a flowchart of a method in one embodiment of a smart testing procedure for mass-produced PCBs.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

It needs to be explained that the description related to "first", "second", and so on in the present disclosure are only describing purpose, and are not being understood as indicating or implying a relative significance of itself or implying an amount of the indicated technical feature. In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one." Embodiments of the present disclosure are described with reference to the drawings.

The present disclosure describes a method for reducing a total time of a testing process and labor cost in testing mass-manufactured printed circuit boards (PCBs).

Figure 4:
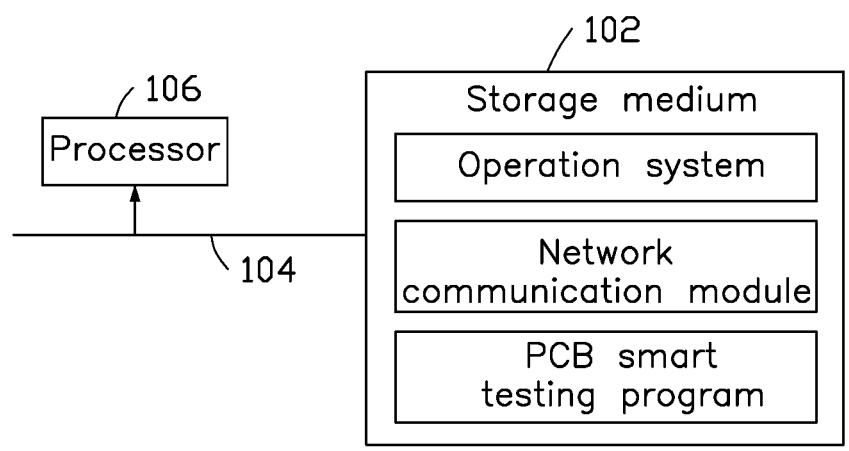
FIG. 4 is a schematic view of an embodiment of a PCB smart testing system.

FIG. 1 shows a flowchart of a method for the above. The method is used in a PCB smart testing system with at least one terminal device and at least one server. The PCB smart testing system provides a visible interface. The visible interface is used for providing an exchanging interface between terminal devices and users, the users can connect with the system through the terminal devices, such as a smart phone or a computer. Data between the terminal devices and the server is transmitted by a specified protocol. In one embodiment, the specified protocol can be a Hyper Text Transfer Protocol (HTTP), or a Hyper Text Transfer Protocol over Secure Socket Layer (HTTPS), not being limited hereto. In one embodiment, the server can be a single server, or can be a group of servers with different functions. The terminal device can be a movable terminal with a networking function, such a personal computer, a tablet, a smart phone, a personal digital assistant (PDA), a game machine, an internet protocol television (IPTV), a smart wearable device, or a navigator. The terminal device can be a fixed terminal with a networking function, such as a desktop computer or a digital television. The PCB smart testing system includes a storage (as shown in FIG. 4) which stores data, codes, test items, and the like. The method compares a yield of target objects after running full-testing and a specified yield, and automatically adjusts test items during the testing process. In one embodiment, the target objects can be chips, PCBs, and other electronic components and devices. The method can comprise at least the following steps, which also may be re-ordered:

Step 10, setting testing parameters based on historical test data and a target decision index according to a setting command.

In one embodiment, there are a number of sets of historical test data. Each historical set includes, a total target object amount, a standard fully-tested amount, test results, and test items in a full test. The test parameters include a total target object amount, a standard fully-tested amount, a first yield threshold value, a second yield threshold value, and a third yield threshold value. The standard fully-tested amount is a target object amount running a full testing in the total target object amount. The standard fully-tested amount is less than the total target object amount. The first yield threshold value is used for limiting an expected yield value of the standard fully-tested amount. The second yield threshold value is used for limiting an expected yield value of the remaining target objects which run the full testing. The third yield threshold value is used for limiting an expected yield value of the remaining target objects which run a sample testing.

The first yield threshold value, the second yield threshold value, and the third yield threshold value can be same, or can be different from each other, or can be partially the same. In one embodiment, the first yield threshold value, the second yield threshold value, and the third yield threshold value are in a percentage format, in which the first yield threshold value is 82.3%, the second yield threshold value is 84%, and the third yield threshold value is 90%. In other embodiments, the first yield threshold value, the second yield threshold value, and the third yield threshold value are in a decimal format, in which the first yield threshold value is 0.823, the second yield threshold value is 0.84, and the third yield threshold value is 0.9.

Figure 2:
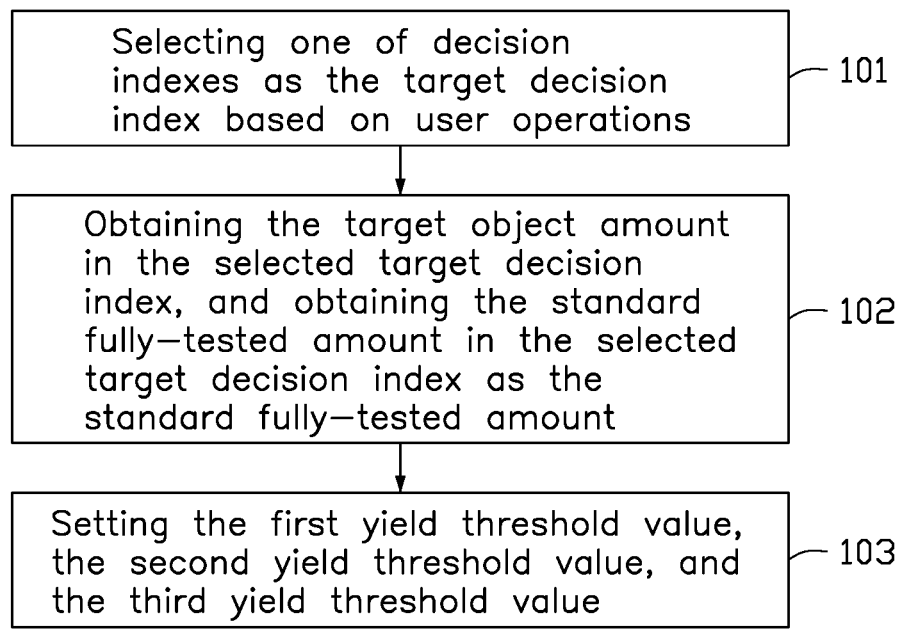
FIG. 2 is a detail flowchart illustrating the step 10 of the method of FIG. 1.

FIG. 2 shows a flowchart of the step 10 in FIG. 1. The step of setting testing parameters based on the historical test data and the target decision index according to the setting command further comprises:

Step 101, selecting one of decision indexes as the target decision index based on user operations.

Step 102, obtaining the target object amount in the selected target decision index, and obtaining the standard fully-tested amount in the selected target decision index as the standard fully-tested amount.

Step 103, setting the first yield threshold value, the second yield threshold value, and the third yield threshold value.

In one embodiment, each decision index corresponds to a various sets of historical test data. The set with minimum values is taken to serve as the optimal set. Each historical set can include the total target object amount, the standard fully-tested amount, and a remaining test amount. Table 1 shows a relationship between the decision index and the historical test data. In the Table 1, B represents the total target object amount, n represents the standard object amount, and m represents the remaining test amount.

TABLE 1 relationship between decision index and the historical test data

| Historical test data | B | n | m | First decision index | Second decision index | Third decision index |
|---|---|---|---|---|---|---|
| 1 | 1000 | 100 | 900 | 0.3 | 0.2 | 0.34 |
| 2 | 1000 | 150 | 850 | 0.3 | 0.32 | 0.4 |
| 3 | 1000 | 200 | 800 | 0.2 | 0.1 | 0.4 |

The first decision index is a result value of a first function based on a first parameter. The first parameter is a yield of the target objects corresponding to the standard fully-tested amount. The second decision index is a result value of a second function based on a second parameter and a third parameter. The second parameter is a difference between a yield of specified target objects running a simulation sampling test and a yield of the specified target objects running the full test. An amount of the specified target objects is a difference between the target object amount and a total amount of the standard fully-tested amount and an amount of the target objects in the remaining target objects running the full test. The specified target objects are run the simulation sampling test. The results of some of the full test items are removed and the results of the remaining test items running the full test serves as the test result of the specified simulation sampling target objects that are running the simulation sampling test. The third parameter is a ratio of the remaining target objects with different test results. The third decision index is a result value of a third function based on the first parameter, the second parameter, and the third parameter. For example, there are 6 test items in the full test, and the target objects A-I are taken to serve as the total target objects in the optimal set of historical test data. The target objects A-C run the standard fully-tested, the target objects D-E are taken to serve as the remaining target objects running the full test, and the target objects F-I are taken to serve as the specified target objects. When the full test results of the target object A and the target object B are determined as "pass", and if the test result of the target object C corresponding to the test item 2 in the full test is determined as "fail", the first parameter based on the first function is determined to be $2/3=0.67$. When the full test results of the target object F, the target object H, and the target object I are determined as "pass", and the test result of the target object G corresponding to the test item 2 in the full test is determined as "fail", the yield of the specified target object is determined to be 0.75. When the simulation sampling test results of the target object F, the target object H, and the target object I, and the target object G without test item 2, a yield of the target objects in the simulation sampling test is 1, and the second parameter is 0.25. When the target object F of the specified target objects corresponding to one test item corresponds to two different test results, and there is "fail" in one of the two test result, and "pass" in the other test result (test item 3), the third parameter is determined to be $1/5=0.2$.

Step 11, obtaining a first specified number of the target objects to run the full test, and calculating a first yield based on the current test result.

In one embodiment, the first specified number is equal to the standard fully-tested amount. The test items in the full test include at least one essential test item and some nonessential test items. When running the full test, each target object corresponding to the first specified number runs all test items. In one embodiment, the test result can be "pass" or "fail". The first yield is a ratio of the "pass" target objects in the first specified number of the target objects.

Step 12, determining whether the first yield is less than the first yield threshold yield according to a first comparing command.

Step 13, obtaining a second specified number of the target objects from the remaining target objects to run the full test, and calculating a second yield based on the test result when the first yield is larger than or equal to the first yield threshold value.

In one embodiment, the second specified number is calculated by a specified function based on the first yield. The second yield is a ratio of the "pass" target objects in the second specified number of the target objects.

Step 14, determining whether the second yield is less than the second yield threshold value according to a second comparing command.

Step 15, selecting some of the remaining target objects to run a sampling test, and calculating a third yield based on the current test result when the second yield is larger than or equal to the second yield threshold value.

In one embodiment, the sampling test includes the at least one essential test item and some of the non-essential test items. The some of the non-essential test items are set by user operation. The third yield is a ratio of "pass" target objects in the selected target objects.

Step 16, determining whether the third yield is less than the third yield threshold value according to a third comparing command.

Step 17, controlling the selected target objects to re-run the full test when the third yield is less than the third yield threshold value.

Step 18, controlling the remaining target objects to run the full test when the first yield is less than the first yield threshold value or when the second yield is less than the second yield threshold value.

The process ends when testing process of the target objects are completed, and all the target objects are satisfied in which the third yield is larger than or equal to the third yield threshold value.

In one embodiment, all commands are inputted by the terminal device. The terminal device can include a keyboard and a touch screen, not being limited. The commands can be inputted by operations on the visible interface. The operations can be sliding operations or click operations (such as a single click or double-click) on keys in the visible interface. In detail, the keys can be mechanical keys or virtual keys (such as virtual icons), but not being limited hereto.

By such method, a yield of "pass" target objects is compared with the specified yield, and test items run by the target objects are automatically adjusted during the testing process. Thus, a total time of the testing process and labor cost are reduced.

Figure 3:
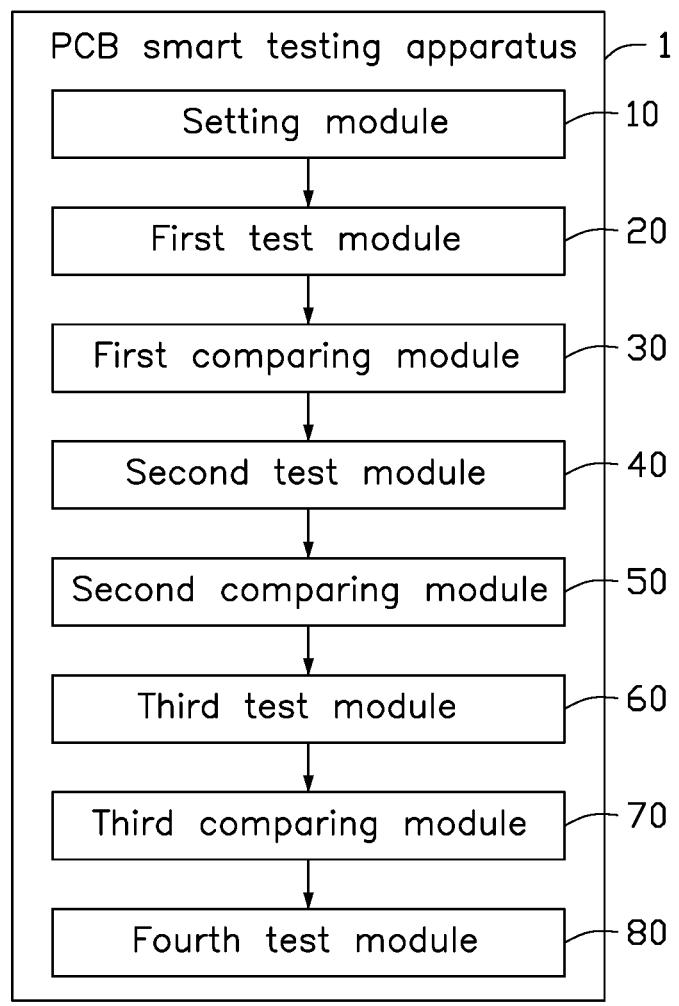
FIG. 3 is a schematic view of an embodiment of a PCB smart testing apparatus.

FIG. 3 shows an apparatus in which the above method can be applied (PCB smart testing apparatus 1). In one embodiment, the PCB smart testing apparatus 1 is used in a PCB smart testing system with at least one terminal device and at least one server. Data between the at least one terminal device and the server is transmitted by a specified protocol. In one embodiment, the specified protocol can be a Hyper Text Transfer Protocol (HTTP), or a Hyper Text Transfer Protocol over Secure Socket Layer (HTTPS), but not being limited hereto. In one embodiment, the server can be a single server, or can be a group of servers with different functions. The terminal device can be a movable terminal with a networking function, such a personal computer, a tablet, a smart phone, a personal digital assistant (PDA), a game machine, an internet protocol television (IPTV), a smart wearable device, or a navigator. The terminal device can be a fixed terminal with a networking function, such as a desktop computer or a digital television. The PCB smart testing system includes a storage (as shown in FIG. 4). The storage stores data, codes, and test items. The PCB smart testing apparatus 1 compares a yield of target objects after full-testing and a specified yield, and automatically adjusts test items during the testing process. In one embodiment, the target objects can be chips, PCBs, and other electronic components and devices. In one embodiment, the target objects can be chips, PCBs, and other electronic components and devices. The PCB smart testing apparatus 1 includes a setting module 10, a first test module 20, a first comparing module 30, a second test module 40, a second comparing module 50, a third test module 60, a third comparing module 70, and a fourth test module 80.

The setting module 10 sets testing parameters based on historical test data and a target decision index according to a setting command.

In one embodiment, there are a number of sets of historical test data. Each historical set includes, a total target object amount, a standard fully-tested amount, test results, and test items in a full test. The test parameters include a total target object amount, a standard fully-tested amount, a first yield threshold value, a second yield threshold value, and a third yield threshold value. The standard fully-tested amount is a target object amount running a full testing in the total target object amount. The standard fully-tested amount is less than the total target object amount. The first yield threshold value is used for limiting an expected yield value of the standard fully-tested amount. The second yield threshold value is used for limiting an expected yield value of the remaining target objects which run the full testing. The third yield threshold value is used for limiting an expected yield value of the remaining target objects which run a sample testing. The first yield threshold value, the second yield threshold value, and the third yield threshold value can be same, or can be different from each other, or can be partially the same. In one embodiment, the first yield threshold value, the second yield threshold value, and the third yield threshold value are in a percentage format, for example, the first yield threshold value is 82.3%, the second yield threshold value is 84%, and the third yield threshold value is 90%. In other embodiments, the first yield threshold value, the second yield threshold value, and the third yield threshold value are in a decimal format, for example, the first yield threshold value is 0.823, the second yield threshold value is 0.84, and the third yield threshold value is 0.9.

The setting module 10 further selects one of decision indexes as the target decision index based on user operations. The setting module 10 further obtains the target object amount in the selected target decision index, and obtains the standard fully-tested amount in the selected target decision index as the standard fully-tested amount. The setting module 10 further sets the first yield threshold value, the second yield threshold value, and the third yield threshold value.

In one embodiment, each decision index corresponds to a number of sets of historical test data. The set with minimum values is taken to serve as the optimal set. Each historical set can include the total target object amount, the standard fully-tested amount, and a remaining test amount. Table 1 shows a relationship between the decision index and the historical test data. In the Table 1, B represents the total target object amount, n represents the standard object amount, and m represents the remaining test amount.

TABLE 1 relationship between decision index and the historical test data

| Historical test data | B | n | m | First decision index | Second decision index | Third decision index |
| --- | --- | --- | --- | --- | --- | --- |
| 1 | 1000 | 100 | 900 | 0.3 | 0.2 | 0.34 |
| 2 | 1000 | 150 | 850 | 0.3 | 0.32 | 0.4 |
| 3 | 1000 | 200 | 800 | 0.2 | 0.1 | 0.4 |

The first decision index is a result value of a first function based on a first parameter. The first parameter is a yield of the target objects corresponding to the standard fully-tested amount. The second decision index is a result value of a second function based on a second parameter and a third parameter. The second parameter is a difference value between a yield of specified target objects running a simulation sampling test and a yield of the specified target objects running the full test. An amount of the specified target objects is a difference between the target object amount and a total amount of the standard fully-tested amount and an amount of the target objects in the remaining target objects running the full test. The specified target objects are run the simulation sampling test. The results of some of the full test items are removed and the results of the remaining test items running the full test serves as the test result of the specified simulation sampling target objects that are run the simulation sampling test. The third parameter is a ratio of the remaining target objects with different test results. The third decision index is a result value of a third function based on the first parameter, the second parameter, and the third parameter. For example, there are 6 test items in the full test, and the target objects A-I are taken to serve as the total target objects in the optimal set of historical test data. The target objects A-C run the standard fully-tested, the target objects D-E are taken to serve as the remaining target objects running the full test, and the target objects F-I are taken to serve as the specified target objects. When the full test results of the target object A and the target object B are determined as "pass", and if the test result of the target object C corresponding to the test item 2 in the full test is determined as "fail", the first parameter based on the first function is determined to be $2/3=0.67$. When the full test results of the target object F, the target object H, and the target object I are determined as "pass", and the test result of the target object G corresponding to the test item 2 in the full test is determined as "fail", the yield of the specified target object is 0.75. When the simulation sampling test results of the target object F, the target object H, and the target object I, and the target object G without test item 2, a yield of the target objects in the simulation sampling test is 1, and the second parameter is 0.25. When the target object F of the specified target objects corresponding to one test item corresponds to two different test results, and there is "fail" in one of the two test result, and "pass" in the other test result (test item 3), the third parameter is determined to be $1/5=0.2$.

The first test module 20 obtains a first specified number of the target objects to run the full test and calculates a first yield based on the current test result.

In one embodiment, the first specified number is equal to the standard fully-tested amount. The test items in the full test include at least one essential test item and some non-essential test items. When running the full test, each target object corresponding to the first specified number runs all test items. In one embodiment, the test result can be "pass" or "fail". The first yield is a ratio of the "pass" target objects in the first specified number of the target objects.

The first comparing module 30 determines whether the first yield is less than the first yield threshold yield according to a first comparing command.

The second test module 40 obtains a second specified number of the target objects from the remaining target objects to run the full test and calculates a second yield based on the test result when the first yield is larger than or equal to the first yield threshold value.

In one embodiment, the second specified number is calculated by a specified function based on the first yield. The second yield is a ratio of the "pass" target objects in the second specified number of the target objects.

The second comparing module 50 determines whether the second yield is less than the second yield threshold value according to a second comparing command.

The third test module 60 selects some of the remaining target objects to run a sampling test and calculates a third yield based on the current test result when the second yield is larger than or equal to the second yield threshold value.

In one embodiment, the sampling test includes the at least one essential test item and some of the non-essential test items. The some of the non-essential test items are set by user operation. The third yield is a ratio of "pass" target objects in the selected target objects.

The third comparing module 70 determines whether the third yield is less than the third yield threshold value according to a third comparing command.

The fourth test module 80 controls the selected target objects to re-running the full test when the third yield is less than the third yield threshold value. The fourth test module 80 further controls the remaining target objects to run the full test when the first yield is less than the first yield threshold value or when the second yield is less than the second yield threshold value.

The process ends when the testing process of the target objects are completed and all the target objects are satisfied in which the third yield is larger than or equal to the third yield threshold value.

Based on the above PCB smart testing apparatus, during the test process, a yield of "pass" target objects is compared with the specified yield, and test items run by the target objects are automatically adjusted during the testing process. Thus, a total time of the testing process and labor cost are reduced.

FIG. 4 shows a PCB smart testing system. The PCB smart testing system includes a processor 106, a storage 102, and communication bus 104.

The storage 102 stores program codes. The storage 102 can be storage circuits without physical manner in an embedded circuit, or a storage in a physical manner, such as a memory, a trans-flash card, a smart media card, a secure digital card, a flash card, and so on. The storage 102 communicates with the processor 106 through the communication bus 106. The storage 102 can include an operation system, a network communication module, and a PCB smart testing programs. The operation system includes programs for managing and controlling hardware and software, supporting the PCB smart testing program and other programs. The network communication module is used for executing communication between different elements in the storage 102, and communication between hardware and software in the PCB smart testing system.

The processor 106 can include one or more microprocessors and digital processors. The processor 106 can invoke program codes in the storage 102 to execute corresponding function. For example, the modules in the FIG. 3 are program codes stored in the storage 102, and are being executed by the processor 106, for implementing a PCB smart testing method. The processor 106 is a central processing unit, which is a large scale integrated circuit. The processor 106 is a calculating core and a control unit.

The processor 106 is used for executing computer instructions stored in the storage 102 to implement the PCB smart testing method. The processor 106 executes the computer instructions to implement the following steps:

Step 10, setting testing parameters based on historical test data and a target decision index according to a setting command.

In one embodiment, there are a number of sets of historical test data. Each historical set includes a total target object amount, a standard fully-tested amount, test results, and test items in a full test. The test parameters include a total target object amount, a standard fully-tested amount, a first yield threshold value, a second yield threshold value, and a third yield threshold value. The standard fully-tested amount is a target object amount running full testing in the total target object amount. The standard fully-tested amount is less than the total target object amount. The first yield threshold value is used for limiting an expected yield value of the standard fully-tested amount. The second yield threshold value is used for limiting an expected yield value of the remaining target objects which run the full testing. The third yield threshold value is used for limiting an expected yield value of the remaining target objects which run sampling testing. The first yield threshold value, the second yield threshold value, and the third yield threshold value can be same, or can be different from each other, or can be partly the same. In one embodiment, the first yield threshold value, the second yield threshold value, and the third yield threshold value are in a percentage format, in which the first yield threshold value is 82.3%, the second yield threshold value is 84%, and the third yield threshold value is 90%. In other embodiments, the first yield threshold value, the second yield threshold value, and the third yield threshold value are in a decimal format, in which the first yield threshold value is 0.823, the second yield threshold value is 0.84, and the third yield threshold value is 0.9.

FIG. 2 shows a flowchart of the step 10 in FIG. 1. The step of setting testing parameters based on the historical test data and a target decision index according to the setting command further comprises:

Step 101, selecting one of decision indexes as the target decision index based on user operations.

Step 102, obtaining the target object amount in the selected target decision index, and obtaining the standard fully-tested amount in the selected target decision index as the standard fully-tested amount.

Step 103, setting the first yield threshold value, the second yield threshold value, and the third yield threshold value.

In one embodiment, each decision index corresponds to a various sets of historical test data. The set with minimum values is taken to serve as the optimal set. Each historical set can include the total target object amount, the standard fully-tested amount, and a remaining test amount. Table 1 shows a relationship between the decision index and the historical test data. In the Table 1, B represents the total target object amount, n represents the standard object amount, and m represents the remaining test amount.

TABLE 1 relationship between decision index and the historical test data

| Historical test data | B | n | m | First decision index | Second decision index | Third decision index |
|---|---|---|---|---|---|---|
| 1 | 1000 | 100 | 900 | 0.3 | 0.2 | 0.34 |
| 2 | 1000 | 150 | 850 | 0.3 | 0.32 | 0.4 |
| 3 | 1000 | 200 | 800 | 0.2 | 0.1 | 0.4 |

The first decision index is a result value of a first function based on a first parameter. The first parameter is a yield of the target objects corresponding to the standard fully-tested amount. The second decision index is a result value of a second function based on a second parameter and a third parameter. The second parameter is a difference between a yield of specified target objects running a simulation sampling test and a yield of the specified target objects running the full test. An amount of the specified target objects is a difference between the target object amount and a total amount of the standard fully-tested amount and an amount of the target objects in the remaining target objects running the full test. The specified target objects are run the simulation sampling test. The results of some of the full test items are removed and the results of the remaining test items running the full test serves as the test result of the specified simulation sampling target objects that are run the simulation sampling test. The third parameter is a ratio of the remaining target objects with different test results. The third decision index is a result value of a third function based on the first parameter, the second parameter, and the third parameter. For example, there are 6 test items in the full test, and the target objects A-I are taken to serve as the total target objects in the optimal set of historical test data. The target objects A-C run the standard fully-tested, the target objects D-E are taken to serve as the remaining target objects running the full test, and the target objects F-I are taken to serve as the specified target objects. When the full test results of the target object A and the target object B are determined as "pass", and if the test result of the target object C corresponding to the test item 2 in the full test is determined as "fail", the first parameter based on the first function is determined to be ⅔=0.67. When the full test results of the target object F, the target object H, and the target object I are determined as "pass", and the test result of the target object G corresponding to the test item 2 in the full test is determined as "fail", the yield of the specified target object is 0.75. When the simulation sampling test results of the target object F, the target object H, and the target object I, and the target object G without test item 2, a yield of the target objects in the simulation sampling test is 1, and the second parameter is 0.25. When the target object F of the specified target objects corresponding to one test item corresponds to two different test results, and there is "fail" in one of the two test result, and "pass" in the other test result (test item 3), the third parameter is determined to be ⅕=0.2.

Step 11, obtaining a first specified number of the target objects to run the full test, and calculating a first yield based on the current test result.

In one embodiment, the first specified number is equal to the standard fully-tested amount. The test items in the full test include at least one essential test item and some non-essential test items. When running the full test, each target object corresponding to the first specified number runs all the test items. In one embodiment, the test result can be "pass" or "fail". The first yield is a ratio of the "pass" target objects in the first specified number of the target objects.

Step 12, determining whether the first yield is less than the first yield threshold yield according to a first comparing command.

Step 13, obtaining a second specified number of the target objects from the remaining target objects to run the full test, and calculating a second yield based on the test result when the first yield is larger than or equal to the first yield threshold value.

In one embodiment, the second specified number is calculated by a specified function based on the first yield. The second yield is a ratio of the "pass" target objects in the second specified number of the target objects.

Step 14, determining whether the second yield is less than the second yield threshold value according to a second comparing command.

Step 15, selecting some of the remaining target objects to run a sampling test, and calculating a third yield based on the current test result when the second yield is larger than or equal to the second yield threshold value.

In one embodiment, the sampling test includes the at least one essential test item and some of the non-essential test items. The some of the non-essential test items are set by user operation. The third yield is a ratio of "pass" target objects with all pass result in the selected target objects.

Step 16, determining whether the third yield is less than the third yield threshold value according to a third comparing command.

Step 17, controlling the selected target objects for re-running the full test when the third yield is less than the third yield threshold value.

Step 18, controlling the remaining target objects to run the full test when the first yield is less than the first yield threshold value or when the second yield is less than the second yield threshold value.

The process ends when the test process of the target objects is completed and all the target objects are satisfied in which the third yield is larger than or equal to the third yield threshold value.

In one embodiment, all commands are inputted by the terminal device.

The terminal device can include a keyboard and a touch screen, but not being limited hereto. The commands can be inputted by operations on the visible interface. The operations can be sliding operations or click operations (such as a single click or double-click) on keys in the visible interface. In detail, the keys can be mechanical keys or virtual keys (such as virtual icons), but not being limited hereto.

Based on the above PCB smart testing system, a yield of "pass" target objects is compared with the specified yield, and test items run by the target objects are automatically adjusted during the testing process. Thus, a total time of the testing process and labor cost are reduced.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A PCB smart testing method comprising:
   setting testing parameters based on historical test data and a target decision index according to a setting command; the test parameters comprises a total target object amount, a first yield threshold value, and a second yield threshold value;
   obtaining a first specified number of target objects to run a full test, and calculating a first yield based on a current test result; the first specified number of the target objects is less than the total target object amount;
   determining whether the first yield is less than the first yield threshold yield according to a first comparing command;
   obtaining a second specified number of the target objects from the remaining target objects to run the full test, and calculating a second yield based on the test result when the first yield is larger than or equal to the first yield threshold value; the second specified number of the target objects is less than the total target object amount;
   determining whether the second yield is less than the second yield threshold value according to a second comparing command; and
   selecting some of the remaining target objects to run a sampling test.

2. The PCB smart testing method of claim 1, wherein test parameters further comprises a third yield threshold value; the PCB smart testing method further comprising:
   calculating a third yield based on the current test result when the second yield is larger than or equal to the second yield threshold value;
   determining whether the third yield is less than the third yield threshold value according to a third comparing command; and
   controlling the selected target object to re-run the full test when the third yield is less than the third yield threshold value.

3. The PCB smart testing method of claim 1, wherein the second specified number of the target objects is calculated by a specified function based on the first yield.

4. The PCB smart testing method of claim 1, wherein the full test comprises test items; the test items comprise at least one essential test item and some non-essential test items; the sampling test comprises the at least one essential test item and some of the non-essential test items.

5. The PCB smart testing method of claim 1, wherein the PCB smart testing method further comprising:
   controlling the remaining target objects to run the full test when the first yield is less than the first yield threshold value or when the second yield is less than the second yield threshold value.

6. The PCB smart testing method of claim 2, wherein there are different decision index and different historical test data; each decision index comprises a number sets of historical test data; the set with minimum values is served as the optimal set; the historical test data comprises a total target object amount, a standard fully-tested amount, and a remaining test amount; the step of setting testing parameters based on historical test data and a target decision index according to the setting command comprising:
   selecting one of decision indexes as the target decision index based on user operations;
   obtaining the target object amount in the selected target decision index, and obtaining the standard fully-tested amount in the selected target decision index as the standard fully-tested amount; and
   setting the first yield threshold value, the second yield threshold value, and the third yield threshold value.

7. A PCB smart testing apparatus comprising:
   a setting module, configured to set testing parameters based on historical test data and a target decision index according to a setting command;
   a first test module, configured to obtain a first specified number of target objects to run a full test, and to calculate a first yield based on a current test result;
   a first comparing module, configured to determine whether the first yield is less than a first yield threshold yield according to a first comparing command;
   a second test module, configured to obtain a second specified number of the target objects from the remaining target objects to run the full test, and to calculate a second yield based on the test result when the first yield is larger than or equal to the first yield threshold value;
   a second comparing module, configured to determine whether the second yield is less than the second yield threshold value according to a second comparing command; and
   a third test module, configured to select some of the remaining target objects to run a sampling test.

8. The PCB smart testing apparatus of claim 7, wherein the test parameters further comprises a third yield threshold value; the third test module further calculates a third yield based on the current test result when the second yield is larger than or equal to the second yield threshold value; the PCB testing apparatus further comprises a third comparing module; the third comparing module determines whether the third yield is less than the third yield threshold value according to a third comparing command; when the third yield is less than the third yield threshold value, the third comparing module controls the selected target object to re-run the full test.

9. The PCB smart testing apparatus of claim 7, wherein the second specified number of the target objects is calculated by a specified function based on the first yield.

10. The PCB smart testing apparatus of claim 7, wherein the full test comprises test items; the test items comprise at least one essential test item and some non-essential test items; the sampling test comprises the at least one essential test item and some of the non-essential test items.

11. The PCB smart testing apparatus of claim 7, wherein the PCB smart testing apparatus further comprises a fourth test module; the fourth test module controls the remaining target objects to run the full test when the first yield is less than the first yield threshold value or when the second yield is less than the second yield threshold value.

12. The PCB smart testing apparatus of claim 8, wherein there are different decision index and different historical test data; each decision index comprises a number sets of historical test data; the set with minimum values is served as the optimal set; the historical test data comprises a total target object amount, a standard fully-tested amount, and a remaining test amount; the setting module further selects one of decision indexes as the target decision index based on user operations, obtains the target object amount in the selected target decision index, and obtains the standard fully-tested amount in the selected target decision index as the standard fully-tested amount; the setting module further sets the first yield threshold value, the second yield threshold value, and the third yield threshold value.

13. A PCB smart testing system comprising:
a setting module, configured to set testing parameters based on historical test data and a target decision index according to a setting command;
a first test module, configured to obtain a first specified number of target objects to run a full test, and to calculate a first yield based on a current test result;
a first comparing module, configured to determine whether the first yield is less than a first yield threshold according to a first comparing command;
a second test module, configured to obtain a second specified number of the target objects from the remaining target objects to run the full test, and to calculate a second yield based on the test result when the first yield is larger than or equal to the first yield threshold value;
a second comparing module, configured to determine whether the second yield is less than the second yield threshold value according to a second comparing command; and
a third test module, configured to select some of the remaining target objects to run a sampling test.

14. The PCB smart testing system of claim 13, wherein the test parameters further comprises a third yield threshold value; the third test module further calculates a third yield based on the current test result when the second yield is larger than or equal to the second yield threshold value; the PCB testing system further comprises a third comparing module; the third comparing module determines whether the third yield is less than the third yield threshold value according to a third comparing command; when the third yield is less than the third yield threshold value, the third comparing module controls the selected target object to re-run the full test.

15. The PCB smart testing system of claim 13, wherein the second specified number of the target objects is calculated by a specified function based on the first yield.

16. The PCB smart testing system of claim 13, wherein the full test comprises test items; the test items comprise at least one essential test item and non-essential test items; the sampling test comprises the at least one essential test item and some of the non-essential test items.

17. The PCB smart testing system of claim 13, wherein the PCB smart testing system further comprises a fourth test module; the fourth test module controls the remaining target objects to run the full test when the first yield is less than the first yield threshold value or when the second yield is less than the second yield threshold value.

18. The PCB smart testing system of claim 14, wherein there are different decision index and different historical test data; each decision index comprises a number sets of historical test data; the set with minimum values is served as the optimal set; the historical test data comprises a total target object amount, a standard fully-tested amount, and a remaining test amount; the setting module further selects one of decision indexes as the target decision index based on user operations, obtains the target object amount in the selected target decision index, and obtains the standard fully-tested amount in the selected target decision index as the standard fully-tested amount; the setting module further sets the first yield threshold value, the second yield threshold value, and the third yield threshold value.

19. A non-transitory storage medium, the non-transitory storage medium is a computer readable storage, and stores at least one instruction, the at least one instruction being executed by a processor to implement following steps:
setting testing parameters based on historical test data and a target decision index according to a setting command; the test parameters comprises a total target object amount, a first yield threshold value, and a second yield threshold value;
obtaining a first specified number of the target objects to run a full test, and calculating a first yield based on a current test result; the first specified number of target objects is less than the total target object amount;
determining whether the first yield is less than the first yield threshold yield according to a first comparing command;
obtaining a second specified number of the target objects from the remaining target objects to run the full test, and calculating a second yield based on the test result when the first yield is larger than or equal to the first yield threshold value; the second specified number of the target objects is less than the total target object amount;
determining whether the second yield is less than the second yield threshold value according to a second comparing command; and
selecting some of the remaining target objects to run a sampling test.

* * * * *